(12) United States Patent
Pruitt et al.

(10) Patent No.: US 11,527,872 B2
(45) Date of Patent: Dec. 13, 2022

(54) DOOR SUPPORT SYSTEM FOR AN ELECTRICAL DISTRIBUTION SYSTEM ENCLOSURE

(71) Applicant: The Durham Co., Lebanon, MO (US)

(72) Inventors: Alva Glen Pruitt, Houston, MO (US); Kenneth J. Driver, Elk Creek, MO (US); Bobby D. Dixon, Houston, MO (US); Jason T. Derrickson, Licking, MO (US)

(73) Assignee: The Durham Co., Lebanon, MO (US)

(*) Notice: Subject to any disclaimer, the term of this patent is extended or adjusted under 35 U.S.C. 154(b) by 676 days.

(21) Appl. No.: 16/530,906

(22) Filed: Aug. 2, 2019

(65) Prior Publication Data

US 2020/0067283 A1 Feb. 27, 2020

Related U.S. Application Data

(60) Provisional application No. 62/721,148, filed on Aug. 22, 2018.

(51) Int. Cl.
| | |
|---|---|
| H02B 1/38 | (2006.01) |
| H02B 7/06 | (2006.01) |
| H02G 3/08 | (2006.01) |
| H05K 5/02 | (2006.01) |
| H05K 7/18 | (2006.01) |
| H02B 5/00 | (2006.01) |
| E06B 1/52 | (2006.01) |
| E05B 63/24 | (2006.01) |

(52) U.S. Cl.
CPC .............. *H02B 1/38* (2013.01); *E05B 63/24* (2013.01); *E06B 1/52* (2013.01); *H02B 7/06* (2013.01); *H02G 3/086* (2013.01); *H05K 5/0226* (2013.01); *H05K 7/183* (2013.01); *E05Y 2900/208* (2013.01)

(58) Field of Classification Search
CPC .. H02B 1/38; H02B 7/06; E05B 63/24; E06B 1/52; H05K 5/0226; H05K 5/0221; H05K 5/0217; H05K 7/183
See application file for complete search history.

(56) References Cited

U.S. PATENT DOCUMENTS

| | | | |
|---|---|---|---|
| 2013/0031840 A1* | 2/2013 | Carralero | E05C 17/28 49/504 |
| 2016/0242302 A1* | 8/2016 | Cox | F16B 2/14 |
| 2017/0311463 A1* | 10/2017 | Best | H02B 1/32 |

* cited by examiner

*Primary Examiner* — Hoa C Nguyen
*Assistant Examiner* — Amol H Patel

(57) ABSTRACT

A door support system is provided for an enclosure of an electrical distribution system. The door support system includes a rail fixedly secured to a door panel of the enclosure. The rail includes at least one notch. The door support system also includes a support member mounted to a frame of the enclosure. The support member is slidably mounted to the rail such that the support member slides along a length of the rail between an extended position and a retracted position. The extended position of the support member supports the door panel in an open position. The support member is in the retracted position when the door panel is in a closed position. The support member includes a detent configured to be received into the notch of the rail to releasably lock the support member in the extended position along the length of the rail.

20 Claims, 7 Drawing Sheets

DOOR SUPPORT SYSTEM FOR AN ELECTRICAL DISTRIBUTION SYSTEM ENCLOSURE

CROSS-REFERENCE TO RELATED APPLICATION

This Applications claims priority to and the benefit of U.S. Provisional Patent Application Ser. No. 62/721,148, filed on Aug. 2, 2018 and entitled "AUTOMATIC ENCLOSURE DOOR SAFETY SYSTEM", which is incorporated herein by reference in its entirety.

BACKGROUND

Electrical distribution systems include enclosures that house various electrical components of the distribution system, for example switchgear (e.g., switching and interrupting devices such as circuit breakers, fuses, relays, etc.), panel boards, cables, control devices, instrumentation, metering devices, etc. The enclosures of electrical distribution systems provide security and environmental protection. The enclosures also provide a physical safety barrier. For example, distribution voltages of electrical distribution systems can range from 15 kV to 35 kV nominal system voltages with a high potential for arc flash due to line to ground or a line to line fault. The enclosures provide a physical barrier that protects linemen and other personnel from exposure to various electrically live components of the electrical distribution system.

Some known electrical distribution system enclosures include hinged door panels that are opened or removed from the enclosure to enable access to the interior of the enclosure for installation, servicing (e.g., maintenance, etc.), and operation (e.g., reading instrumentation, metering devices, etc.) of the various electrical and/or other components of the electrical distribution system. But, the relatively large door panels may be cumbersome to remove. For example, removing a door panel from the enclosure and moving the door panel safely out of the way may require two or more personnel due to the relatively large size and weight of the door panels. Moreover, the unexpected closure of an open door panel (e.g., via wind, the weight of the door panel, etc.) can potentially cause serious injury to personnel accessing the interior of the enclosure through the opening. For example, the weight of the door panel can cause crush damage to a person's torso and/or appendages. Moreover, and for example, the unexpected closure of a door panel may force the personnel into contact with potentially electrically live components of the electrical distribution system that are exposed through the opening.

To prevent the accidental closure of an open door panel, some enclosures are provided with a prop that can be positioned to hold the door panel open. But, high wind conditions can disengage the props and enable the door panel to accidentally close. Moreover, if not properly stowed away after use the prop can contact potentially electrically live components of the electrical distribution system when the door is purposefully closed, which may cause an electrical short. Some known door panels are provided with one or more assist mechanisms (e.g., gas springs, etc.) that assist opening the door panel and holding the door panel open. But, the door panel can still accidentally close and thereby potentially injure personnel via outright failure of the assist mechanisms and/or wind conditions overcoming the forces provided by the assist mechanisms that hold the door panel open.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one aspect, a door support system is provided for an enclosure of an electrical distribution system. The door support system includes a rail configured to be fixedly secured to a door panel of the enclosure. The rail includes at least one notch. The door support system also includes a support member configured to be mounted to at least one of a frame or another panel of the enclosure. The support member is configured to be slidably mounted to the rail such that the support member slides along a length of the rail between an extended position and a retracted position. The extended position of the support member is configured to support the door panel in an open position of the door panel. The support member is configured to be in the retracted position when the door panel is in a closed position of the door panel. The support member includes a detent configured to be received into the notch of the rail to releasably lock the support member in the extended position along the length of the rail.

In another aspect, an enclosure for an electrical distribution system includes a frame having an interior compartment configured to hold at least one electrical component, and a door panel mounted to the frame at a hinge. The door panel is movable about the hinge between a closed position that closes an opening of the frame and an open position that exposes the interior compartment through the opening. The enclosure includes a door support system that includes a rail fixedly secured to the door panel. The rail includes at least one notch. The door support system also includes a support member mounted to the frame of the enclosure. The support member is slidably mounted to the rail such that the support member slides along a length of the rail between an extended position and a retracted position. The extended position of the support member supports the door panel in an open position of the door panel. The support member is in the retracted position when the door panel is in a closed position of the door panel. The support member includes a detent configured to be received into the notch of the rail to releasably lock the support member in the extended position along the length of the rail.

In another aspect, a door support system is provided for an enclosure of an electrical distribution system. The door support system includes a rail configured to be fixedly secured to a door panel of the enclosure. The rail includes a slot that extends along a length of the rail, the slot comprising at least one notch. The door support system also includes a support member configured to be mounted to a frame of the enclosure. The support member is configured to be slidably mounted to the rail such that the support member slides along the length of the rail between an extended position and a retracted position. The extended position of the support member is configured to support the door panel in an open position of the door panel. The support member is configured to be in the retracted position when the door panel is in a closed position of the door panel. The support member includes a detent that includes a locking pin and a biasing mechanism configured to force the locking pin into the notch of the slot when the support member slides along the length of the rail to the extended position to releasably lock the support member in the extended position.

Other aspects, features, and advantages will become apparent from the following detailed description when taken in conjunction with the accompanying drawings, which are a part of this disclosure and which illustrate, by way of example, principles of the inventions disclosed.

BRIEF DESCRIPTION OF THE DRAWINGS

Corresponding reference characters indicate corresponding parts throughout the drawings.

DETAILED DESCRIPTION

Certain embodiments of the disclosure provide a door support system for an enclosure of an electrical distribution system. The door support system includes a rail configured to be fixedly secured to a door panel of the enclosure. The rail includes at least one notch. The door support system also includes a support member configured to be mounted to a frame of the enclosure. The support member is configured to be slidably mounted to the rail such that the support member slides along a length of the rail between an extended position and a retracted position. The extended position of the support member is configured to support the door panel in an open position of the door panel. The support member is configured to be in the retracted position when the door panel is in a closed position of the door panel. The support member includes a detent configured to be received into the notch of the rail to releasably lock the support member in the extended position along the length of the rail.

Certain embodiments of the disclosure provide a door support system that enables the door panel of an electrical distribution system enclosure to be moved to and secured in an open position using less personnel. For example, certain embodiments of the disclosure provide a door support system that enables the door panel of an electrical distribution system enclosure to be safely moved to and secured in an open position by a single person.

Certain embodiments of the disclosure provide a door support system that increases the safety of installation, servicing, and/or operation of components of electrical distribution systems. Certain embodiments of the disclosure thereby reduce the likelihood and severity of injury to personnel installing, servicing, and/or operating electrical distribution systems. For example, certain embodiments of the disclosure provide a door support system that enables one or more personnel to safely open and secure the door panel of an electrical distribution system enclosure without being exposed to electrically live components (e.g., electrical components housed within the interior of the enclosure, portions of the enclosure carrying electricity, etc.). Moreover, and for example, certain embodiments of the disclosure provide a door support system that can better withstand wind conditions and/or component failures such that the door panels of electrical distribution systems are less likely to accidentally close onto personnel accessing interior compartments of electrical distribution system enclosures.

Figure 1:
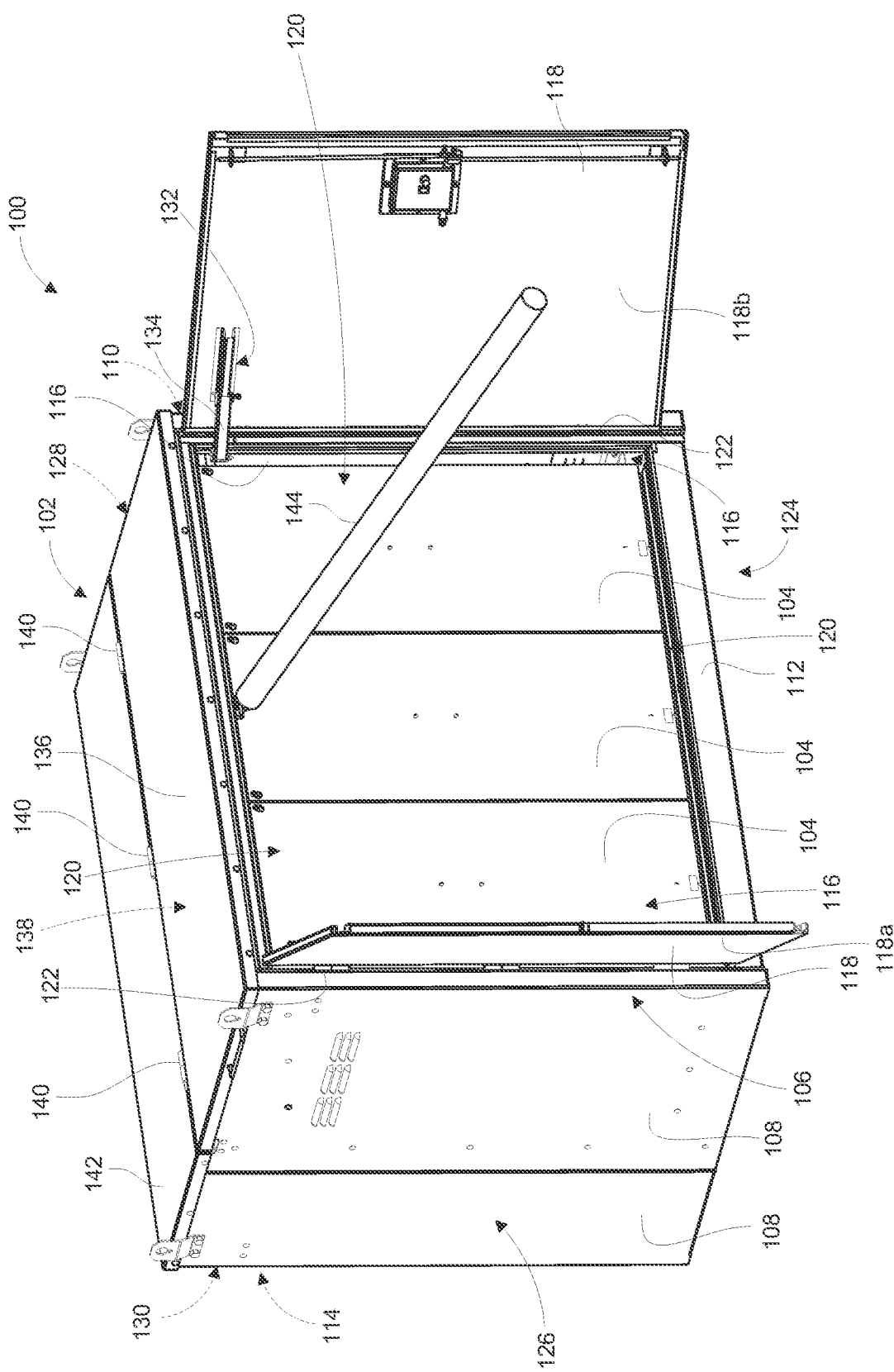
FIG. 1 is a perspective view illustrating an electrical distribution system according to an exemplary embodiment.
Figure 2:
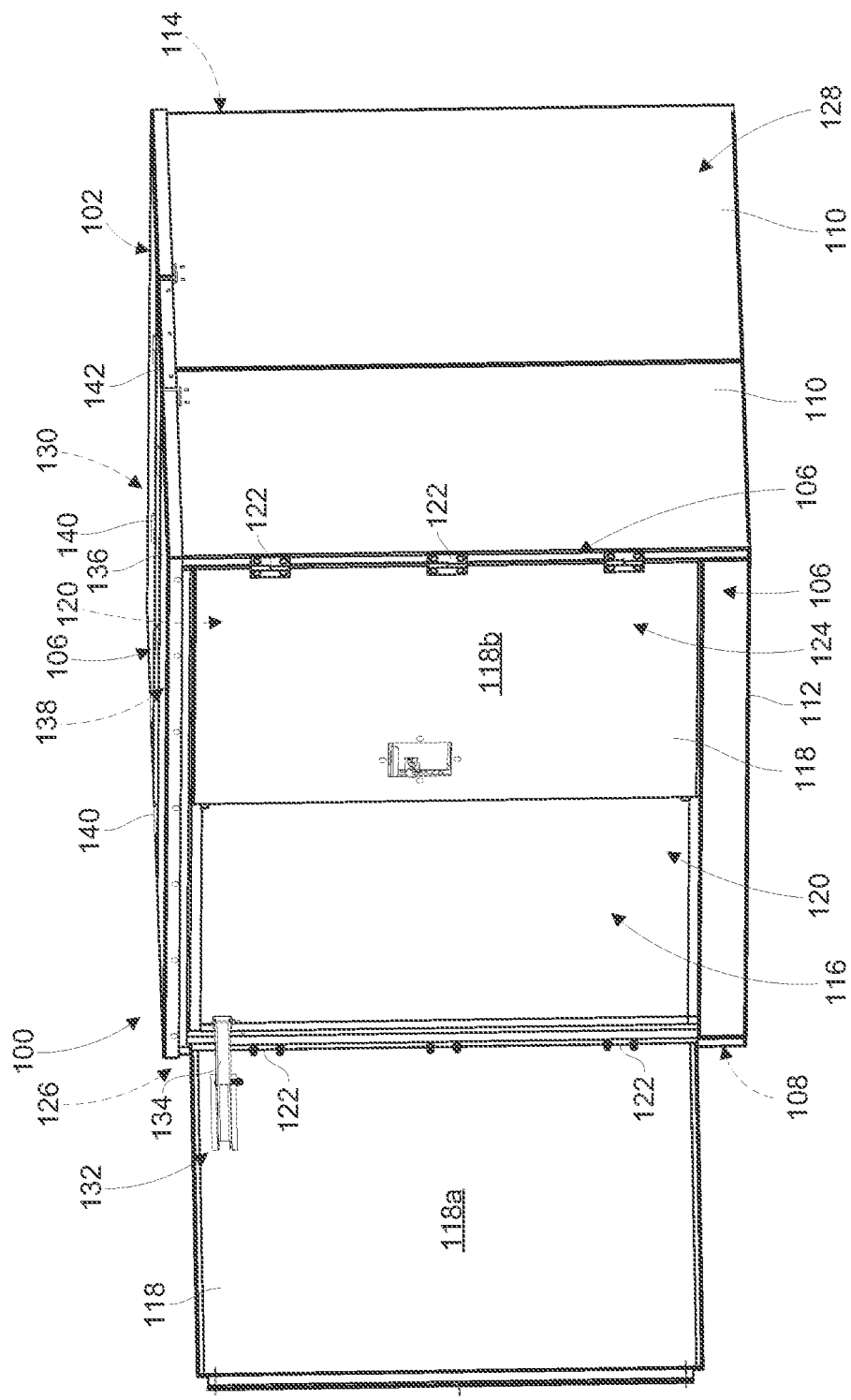
FIG. 2 is another perspective view of the electrical distribution system shown in FIG. 1.

Referring now to FIGS. 1 and 2, an electrical distribution system 100 includes an enclosure 102 and one or more electrical components 104 (not shown in FIG. 2) housed within the enclosure 102. The enclosure 102 includes a frame 106 having a pair of opposite side panels 108 and 110 (the side panel 108 is not visible in FIG. 2 and the side panel 110 is not visible in FIG. 1), a lower panel 112, and a rear panel 114 (not visible in FIGS. 1 and 2). The frame 106 includes an interior compartment 116 that is defined between the panels 108, 110, 112, and 114. As shown in FIG. 1, the interior compartment 116 holds the electrical component(s) 104 therein. The enclosure 102 includes one or more door panels 118 mounted to the frame 106 for exposing the interior compartment 116 through a front opening 120 of the frame 106. In the exemplary embodiment, the enclosure 102 includes two door panels 118, namely door panels 118a and 118b. But, the enclosure 102 may include any other number of door panels 118 for exposing the interior compartment 116 through the front opening 120 (e.g., a single door panel 118, three or more door panels 118, etc.).

Figure 7:
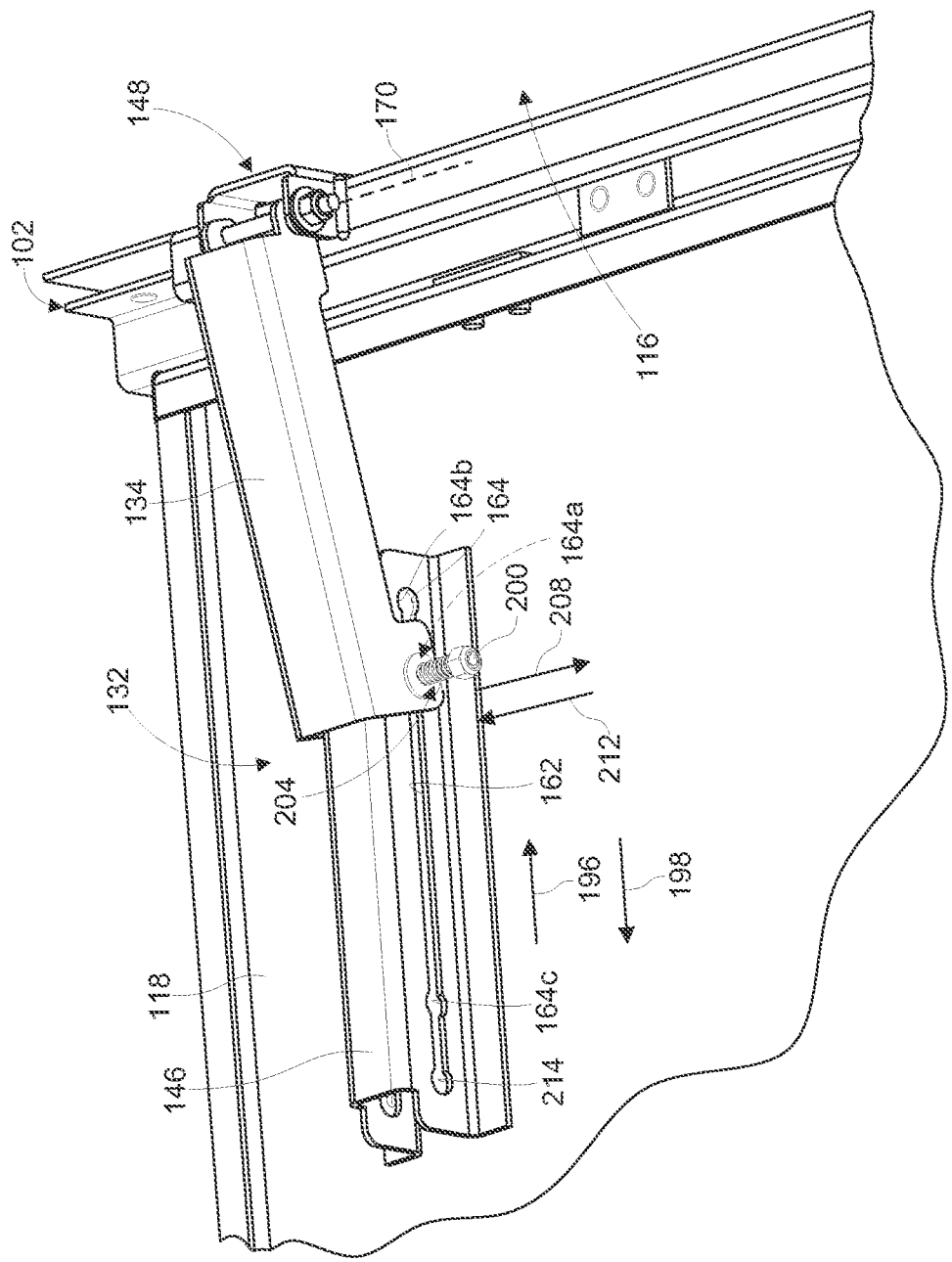
FIG. 7 is another perspective view illustrating the door support system shown in FIGS. 3-6 with the door panel of the electrical distribution system in another open position according to an exemplary embodiment.

Each of the door panels 118 is mounted to the frame 106 at one or more hinges 122 such that each door panel 118 is moveable (e.g., rotatable, etc.) about the hinge(s) 122 between a closed position and one or more open positions. In the closed position, each door panel 118 closes at least a portion of the front opening 120 of the frame 106. In the open position(s), each door panel 118 exposes the interior compartment 116 of the frame 106 through the front opening 120. The door panels 118a and 118b of the exemplary embodiment are shown in FIG. 1 in an open position, while in FIG. 2 the door panel 118a is shown in an open position and the door panel 118b is shown in the closed position. Another open position of the door panels 118 is illustrated in FIG. 7.

Although shown and described herein as being located at a front 124 of the enclosure 102 for enabling access to the interior compartment 116 of the enclosure 102 through the front opening 120, it should be understood that the door panels 118 additionally or alternatively may be located at any other location along the enclosure for enabling access to the interior compartment 116. For example, in addition or alternative to the door panels 118 shown herein along the front 124 of the enclosure 102, the enclosure 102 may include: (1) one or more door panels 118 located along a side 126 (not visible in FIG. 2; e.g., in place of or in addition to the side panel 108, etc.) of the enclosure 102 for enabling access to the interior compartment 116 through an opening (not shown) in the side 126 of the enclosure 102; (2) one or more door panels 118 located along a side 128 (not visible in FIG. 1; e.g., in place of or in addition to the side panel 110, etc.) of the enclosure 102 for enabling access to the interior compartment 116 through an opening (not shown) in the side 128 of the enclosure; and/or (3) one or more door panels 118 located along a rear 130 (not visible in FIGS. 1 and 2; e.g., in place of or in addition to the rear panel 114, etc.) of the enclosure 102 for enabling access to the interior compartment 116 through an opening (not shown) in the rear 130 of the enclosure 102.

The enclosure 102 includes one or more door support systems 132 that facilitate operation of the door panels 118. As will be described in more detail below, each door support system 132 includes a support member 134 having one or more extended positions that supports the corresponding door panel 118 in one or more corresponding open positions thereof. As will also be described below, the support member 134 is releasably lockable in the extended position(s) to lock the corresponding door panel 118 in the open position(s) thereof. Although each door panel 118 is shown as including a single door support system 132, each door panel 118 may include any number of the door support systems 132. Optionally, one or more of the door panels 118 includes one or more gas springs (not shown; sometimes referred to as "gas struts") and/or another type of assist mechanism operatively connected between the door panel 118 and another portion of the enclosure 102 (e.g., the frame 106, another panel of the enclosure 102, etc.) to provide an assisting force that assists movement of the door panel 118 from the closed position to the open position(s) and/or that assists holding the door panel 118 in an open position thereof.

Optionally, the enclosure 102 includes a roof panel 136 mounted to the frame 106 for exposing the interior compartment 116 through an upper opening 138 of the frame 106. The roof panel 136 is moveable between a closed position (shown in FIGS. 1 and 2) that closes the upper opening 138 of the frame 106 and an open position (not shown) that exposes the interior compartment 116 through the upper opening 138. In the example shown herein, the roof panel 136 is hingedly mounted to the frame 106 for moving (e.g., rotating, etc.) about hinges 140 between the open and closed positions. In other embodiments, the roof panel 136 is moveable between the open and closed positions in another manner (e.g., a sliding roof panel 136, etc.).

In the exemplary embodiment, the frame 106 includes a fixed roof panel 142 that covers and thereby closes a portion of the upper opening 138 of the frame 106. In other examples, the roof panel 142 is not fixed in position, but rather is moveable between an open position and a closed position, for example similar to the hinged roof panel 136 or in another manner (e.g., a sliding panel, etc.). In still other embodiments, the roof panel 136 covers an approximate entirety of the upper opening 138 of the frame 106.

The enclosure 102 optionally includes a hot stick 144 (not shown in FIG. 2) that enables a person (e.g., a user of the hot stick 144, etc.) to move the door panels 118 and/or the roof panel 136 between the closed and open positions thereof without directly engaging (e.g., grasping, pressing against, pushing, etc.) the door panels 118 and/or the roof panel 136. The length of the hot stick 144 may have any dimension, which for example may be selected to enable the user to move the door panels 118 and/or the roof panel 136 between the open and closed positions from a predetermined distance away from the enclosure 102. Optionally, the hot stick 144 is permanently jointed to a door panel 118 or the roof panel 136. In other examples, the hot stick 144 is releasably connectable to the roof panel 136 and/or one or more of the door panels 118. In some examples, the hot stick 144 is carried by a person to the electrical distribution system 100 from a remote location, is stored nearby the electrical distribution system 100, etc.).

The frame 106 may include one or more other panels, members, supports, structures, dividers, and/or the like in addition or alternative to the panels 108, 110, 112, 114, and/or 142. For example, the frame 106 may include one or more internal supports (not shown) that extend between the side panels 108 and 110 (e.g., for strengthening the frame 106; for supporting one or more of the panels 108, 110, 112, 114, 134, and/or 140; for supporting one or more of the electrical components 104; for supporting one or more components of the door support system 132, etc.). Moreover, and for example, the frame 106 may include one or more dividers (not shown) that facilitate separating, supporting, and/or the like the electrical components 104 housed within the enclosure 102. Although shown has having the shape of a parallelepiped, additionally or alternatively the enclosure 102 includes any other shape.

The enclosure 102 may contain (e.g., house, etc.) any number and type of electrical components 104, such as, but not limited to, switchgear (e.g., switching and interrupting devices such as circuit breakers, fuses, relays, etc.), panel boards, control devices, cables, instrumentation, metering devices, and/or the like. In addition to the electrical components 104, the enclosure 102 may contain non-electrical components (e.g., seals, mechanical supports, connectors, fasteners, other hardware, etc.) that facilitate supporting the operation of the electrical components 104.

Figure 3:
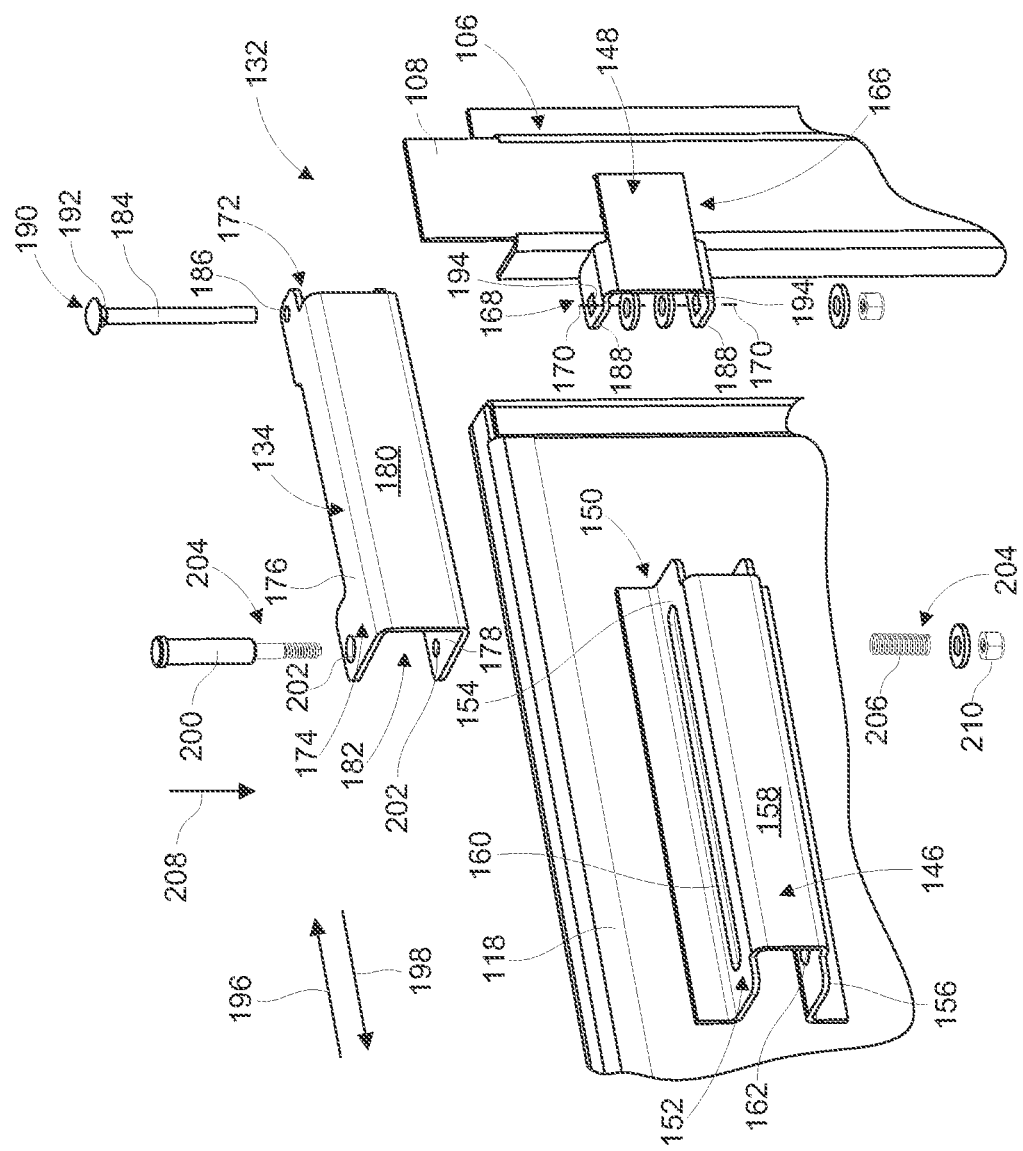
FIG. 3 is an exploded perspective view of a portion of the electrical distribution system shown in FIGS. 1 and 2 illustrating a door support system according to an exemplary embodiment.
Figure 4:
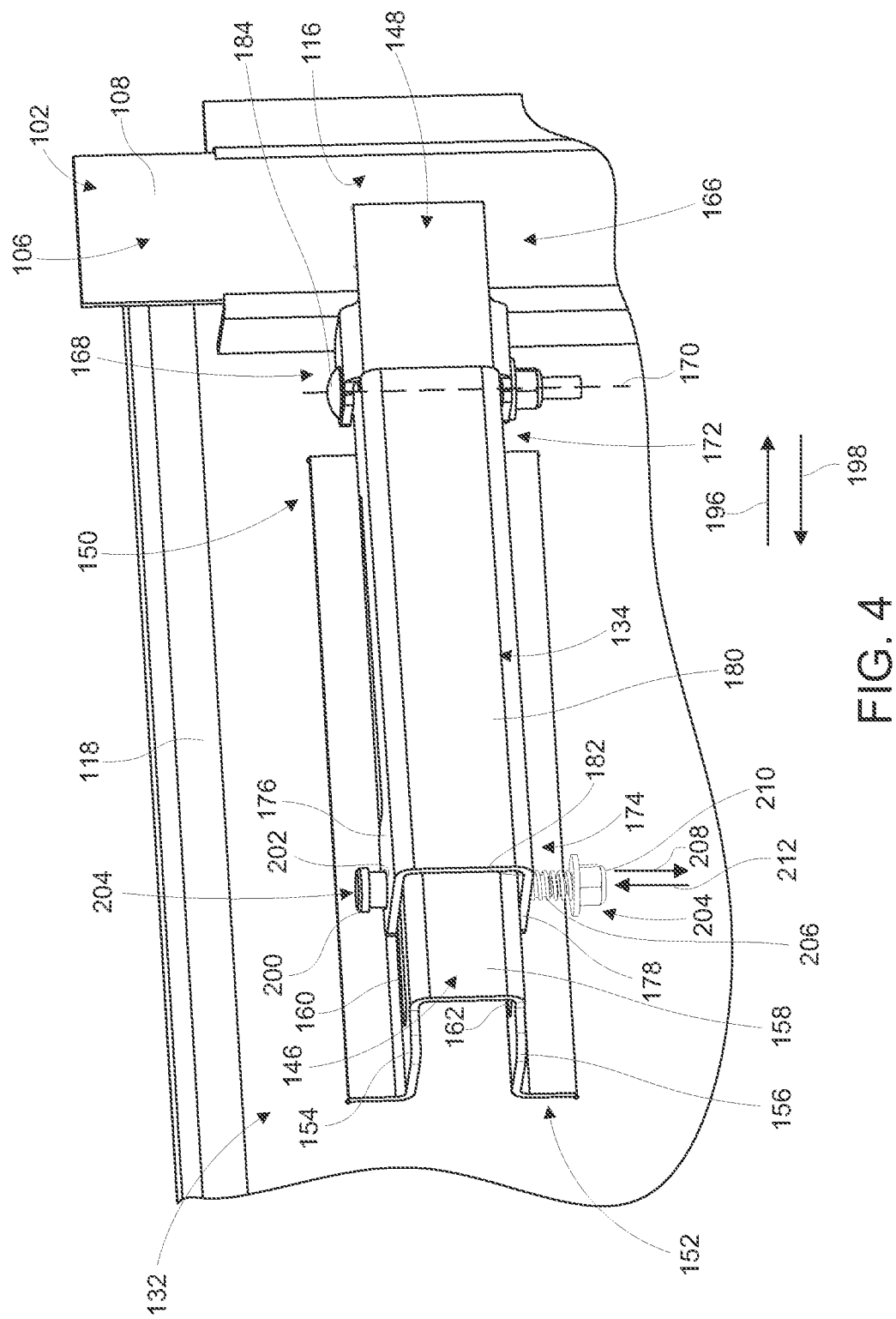
FIG. 4 is an unexploded perspective view illustrating the door support system shown in FIG. 3 with a door panel of the electrical distribution system in a closed position according to an exemplary embodiment.
Figure 5:
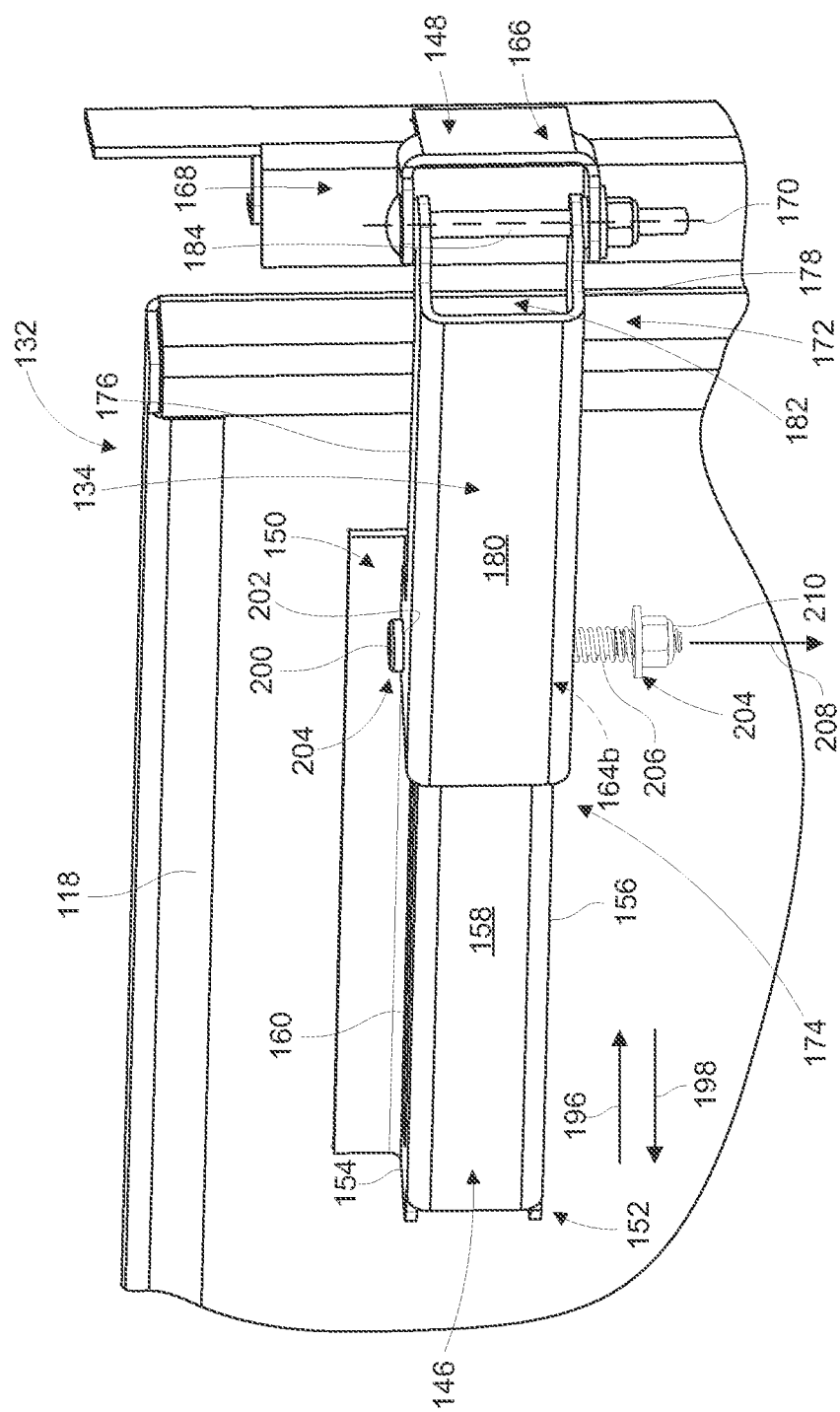
FIG. 5 is another perspective view illustrating the door support system shown in FIGS. 3 and 4 with the door panel of the electrical distribution system in an open position according to an exemplary embodiment.
Figure 6:
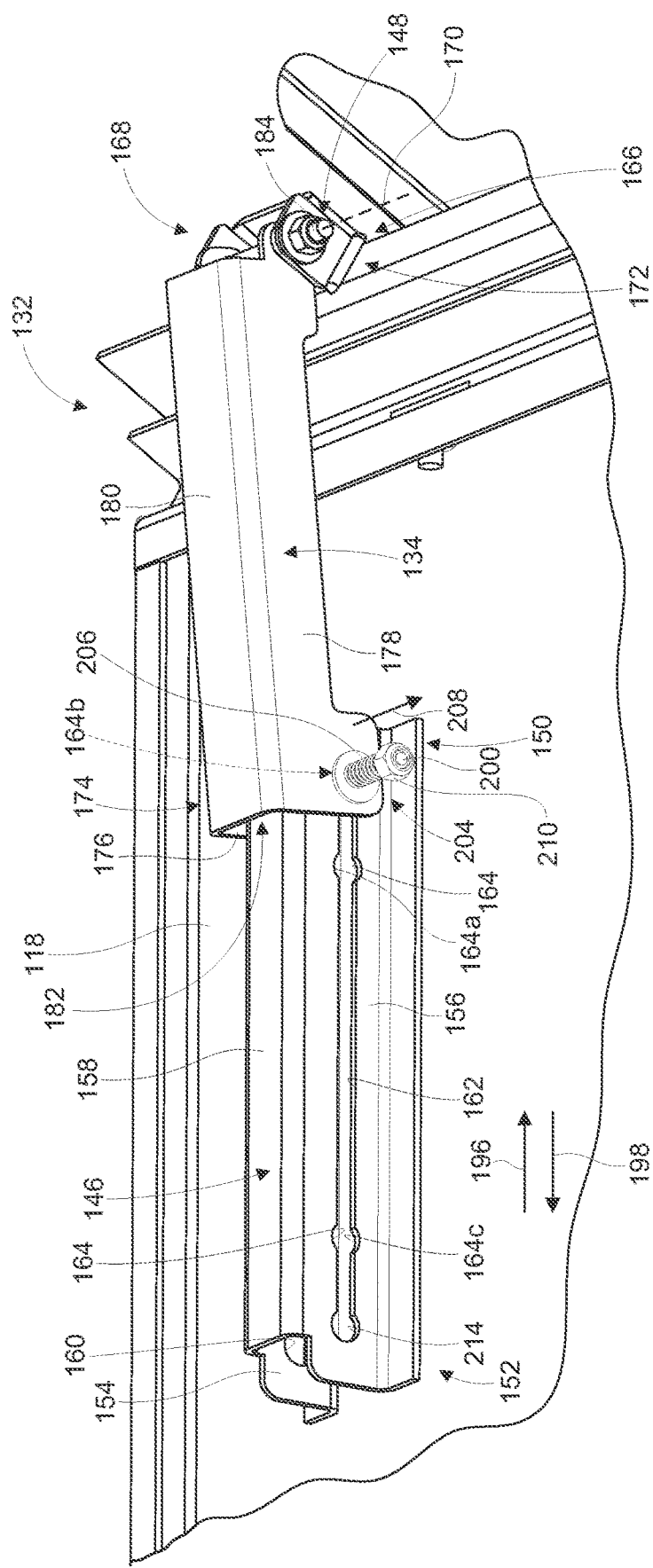
FIG. 6 is another perspective view illustrating the door support system shown in FIGS. 3-5 with the door panel of the electrical distribution system in the open position shown in FIG. 5.

Referring now to FIGS. 3-6, the door support system 132 includes the support member 134, a rail 146, and a hinge 148. The rail 146 is fixedly secured (e.g., mounted, etc.) to the corresponding door panel 118 such that the rail 146 does not move relative to the door panel 118 as the door panel 118 is moved between the closed and open positions. The rail 146 extends a length from an end portion 150 to an opposite end portion 152. In the exemplary embodiment, the rail 146 includes a u-shape defined by an upper rail member 154, a lower rail member 156, and a cross-member 158 that joins the upper rail member 154 to the lower rail member 156. As best seen in FIGS. 3 and 6 respectively, the upper rail member 154 and the lower rail member 156 each include a respective slot 160 and 162 that extends a length along the length of the rail 146. As shown in FIG. 6, the slot 162 of the lower rail member 156 includes one or more notches 164 in the exemplary embodiment. As will be described below, each notch 164 is located at a position along the length of the slot 162 that corresponds to an extended position of the support member 134.

The rail 146 may be fixedly secured to the corresponding door panel 118 using any method, means, mechanism, manner, connection, device, and/or the like, such as, but not limited to, an adhesive, a fastener (e.g., a threaded fastener), a latch, welding, brazing, an epoxy, a clip, a ring, a cotter pin, a quick release pin, a clevis, a spring override, and/or the like. In some examples, the rail 146 is fixedly secured to the corresponding door panel 118 such that the rail 146 is field removable, for example for service, removal of the door panel 118 from the enclosure 102, etc.

The rail 146 is not limited to the configuration shown herein. Rather, the rail 146 additionally or alternatively may have any other configuration that enables the rail 146 to function as described and/or illustrated herein. For example, although shown as having the u-shape and the upper and lower rail members 154 and 156, respectively, the rail 146 additionally or alternatively may include any other shape and/or any other number of rail members. In one example, the rail 146 includes only a single rail member (e.g., includes only the rail member 154 or the rail member 156, etc.). In another example, the rail members 154 and 156 are not joined together by the cross-member 158 (e.g., the rail 146 does not include the cross-member 158, etc.). In another example, the lower rail member 156 does not include the slot 162 and the slot 160 of the upper rail member 154 includes the notch(es) 164. In yet another example, the lower rail member 156 does not include the slot 162 but includes one or more notches, openings, recesses, dimples, and/or the like that perform the function (described below) of the illustrated exemplary notch(es) 164. Still another example includes providing the notch(es) 164 within the slot 160 of the upper rail member 154 in addition or alternative to providing the notch(es) 164 within the slot 162 of the lower rail member 156.

The hinge 148 is fixedly secured (e.g., mounted, etc.) to the frame 106 such that the hinge 148 does not move relative to the frame 106 or the corresponding door panel 118 as the corresponding door panel 118 is moved between the closed and open positions. The hinge 148 extends a length from an end portion 166 that is secured to the frame 106 to an opposite end portion 168. As will be described in more detail below, the end portion 168 of the hinge 148 provides a pivot point 170 about which the support member 134 pivots (e.g., rotates, etc.) during opening and closing of the corresponding door panel 118.

The end portion 166 of the hinge 148 may be secured directly to the corresponding side panel 108 or 110 of the frame 106 and/or to a support of the frame 106 to which the corresponding side panel 108 or 110 is mounted. The end portion 166 of the hinge 148 may be fixedly secured to the frame 106 using any method, means, mechanism, manner, connection, device, and/or the like, such as, but not limited to, an adhesive, a fastener (e.g., a threaded fastener), a latch, welding, brazing, an epoxy, a clip, a ring, a cotter pin, a quick release pin, a clevis, a spring override, and/or the like. In some examples, the hinge 148 is fixedly secured to the frame 106 such that the hinge 148 field removable, for example for service, removal of the corresponding door panel 118 from the enclosure 102, etc.

The support member 134 is a rigid member that extends a length from an end portion 172 to an opposite end portion 174. As shown in FIGS. 3-6, the support member 134 is mounted between the corresponding door panel 118 and the frame 106. Specifically, the end portion 172 of the support member 134 is mounted to the hinge 148, while the opposite end portion 174 is slidably mounted to the rail 146, as will be described in more detail below. In the exemplary embodiment, the support member 134 includes a u-shape defined by an upper member 176, a lower member 178, and a cross-member 180 that joins the upper member 176 to the lower member 178.

The support member 134 is not limited to the configuration shown herein. Rather, the support member 134 additionally or alternatively may have any other configuration that enables the support member 134 to function as described and/or illustrated herein. For example, although shown as having the u-shape and the upper and lower members 176 and 178, respectively, the support member 134 additionally or alternatively may include any other shape and/or any other number of members. In one example, the support member 134 includes only a single member (e.g., includes only the upper member 176 or the lower member 178, etc.). In another example, the upper and lower members 176 and 178, respectively, are not joined together by the cross-member 180 (e.g., the support member 134 does not include the cross-member 180, etc.).

As briefly described above, the end portion 172 of the support member 134 is hingedly mounted to the frame 106 via the hinge 148. Specifically, the end portion 172 of the support member 134 is mounted to the end portion 168 of the hinge 148 such that the support member 134 is pivotable (e.g., rotatable, etc.) about the pivot point 170 of the hinge 148 as the corresponding door panel 118 moves between the open and closed positions. In the exemplary embodiment, the end portion 172 of the support member 134 is rotatably mounted to the end portion 168 of the hinge 148 via a pivot pin 184 that extends through openings 186 and 188 (not visible in FIGS. 4-6) of the end portions 172 and 168 of the support member 134 and the hinge 148, respectively. As shown in FIG. 3, a head 190 of the pivot pin 184 includes one or more flats 192 that interlock with flats 194 of a corresponding opening 188 of the end portion 168 of the hinge 148 such that the pivot pin 184. Accordingly, in the exemplary embodiment, the pivot pin 184 remains stationary about the pivot point 170 as the support member 134 pivots (e.g., rotates, etc.) about the pivot point 170. In other words, the support member 134 pivots (e.g., rotates, etc.) about the pivot pin 184 to thereby pivot about the pivot point 170. In other embodiments, the end portion 172 of the support member 134 is interlocked with the pivot pin 184 and the pivot pin 184 is free to rotate within the openings 188 of the hinge 148 such that the pivot pin 184 and the support member 134 pivot (e.g., rotate) together about the pivot point 170.

The pivot pin 184 is not limited to the exemplary threaded fastener shown herein. Rather, the pivot pin 184 may be held in position within the openings 186 and/or 188 using any other method, means, mechanism, manner, connection, device, and/or the like, such as, but not limited to, an adhesive, an interference fit, a snap-fit, welding, brazing, an epoxy, a clip, a ring, a cotter pin, a quick release pin, a clevis-type connection, a bayonet connection, a spring override, and/or the like. Moreover, the support member 134 is not limited to the exemplary hinge arrangement using the pivot pin 184. Rather, the support member 134 additionally or alternatively may be hingedly mounted to the frame 106 via any other type of hinge and/or other mechanism that enables the support member 134 to pivot (e.g., rotate, etc.) about a pivot point as the corresponding door panel 118 moves between the open and closed positions. Although the end portion 172 of the support member 134 is shown herein as being nested (e.g., received, etc.) within the end portion 168 of the hinge 148, in other examples the end portion 168 of the hinge 148 is nested within the end portion 172 of the support member 134.

As briefly described above, the support member 134 includes one or more extended positions that support the corresponding door panel 118 in one or more corresponding open positions thereof. Specifically, the support member 134 is movable relative to the rail 146 between a retracted position and the extended position(s). The support member 134 is in the retracted position when the corresponding door panel 118 is in the closed position. As briefly described above, the end portion 174 of the support member 134 is slidably mounted to the rail 146. Specifically, the support member 134 moves between the retracted position and the extended position(s) by sliding along the length of the rail 146 in the directions of the arrows 196 and 198. Accordingly, the support member 134 slides along the length of the rail 146 between the extended position(s) and the retracted position. The support member 134 is shown in an extended position in FIGS. 5 and 6, while FIG. 4 illustrates the retracted position of the support member 134. Another extended position of the support member 134 is shown in FIG. 7.

In the exemplary embodiment, the support member 134 is slidably mounted to the rail 146 using a locking pin 200. Specifically, the locking pin 200 extends through openings 202 (not visible in FIG. 6) of the end portion 174 of the support member 134 and through the slots 160 and 162 of the rail 146 to hold the end portion 174 of the support member 134 to the rail 146. During the sliding movement of the support member 134 along the length of the rail 146, the locking pin 200 slides along the length of and within the slots 160 and 162 of the rail 146 to guide the movement of the support member 134 between the extended position(s) and the retracted position. In other words, the locking pin 200 extends within the slots 160 and 162 and moves along the lengths of the slots 160 and 162 as the support member 134 slides along the length of the rail 146 between the extended position(s) and the retracted position.

As best seen in FIGS. 4-6, in the exemplary embodiment the rail 146 is nested (e.g., received, etc.) within an opening 182 of the u-shape of the support member 134 when the support member 134 is slidably mounted to the rail 146 as described above. In other examples, the end portion 174 of the support member 134 is slidably mounted to the rail 146 such that the end portion 174 is nested (e.g., received, etc.) between the rail members 154 and 156 of the rail 146 (e.g., in embodiments wherein the rail 146 does not include the cross-member 158, in embodiments, wherein the rail 146 only includes a portion of the cross-member 158, etc.).

As briefly described above, the support member 134 is releasably lockable in the extended position(s) to lock the corresponding door panel 118 in the open position(s) thereof. Specifically, the support member 134 includes a detent 204 that is configured to be received into the notch(es) 164 of the rail 146 to releasably lock the support member 134 in the extended positions. In the exemplary embodiment, the detent 204 includes the locking pin 200 and a biasing mechanism 206. The biasing mechanism 206 is operatively connected to the locking pin 200 (e.g., between the locking pin 200 and the rail 146, etc.) such that the biasing mechanism 206 is configured to exert a biasing force that biases the locking pin 200 in the direction of the arrow 208. The biasing force exerted by the biasing mechanism 206 in the direction 208 forces the locking pin 200 into the notch(es) 164 of the rail 146 when the support member 134 slides along the length of the rail 146 to the extended position(s). When received within a notch 164, engagement between the locking pin 200 and the notch 164 prevents the support member 134 from sliding along the length of the rail 146 in the direction 198 to thereby prevent the support member 134 from moving from the corresponding extended position toward the retracted position. In other words, the engagement between the locking pin 200 of the support member 134 and the notch 164 of the rail 146 holds (e.g., maintains, etc.) the support member 134 in the corresponding extended position. The extended position of the support member 134 thus supports the corresponding door panel 118 in the corresponding open position (e.g., prevents the door panel 118 from closing, etc.) against the weight of the door panel 118, against other forces (e.g., wind forces, inadvertent force applied by a person or animal, etc.) acting to close the door panel 118, despite failure of one or more gas springs, and/or the like.

The detent 204 is not limited to the exemplary configuration, arrangement, mechanism, structure, and/or the like, shown herein. Rather, the detent 204 additionally or alternatively may include any other type of configuration, arrangement, mechanism, structure, and/or the like, such as, but not limited to, a ratchet and pawl arrangement, and/or the like. For example, in the exemplary embodiment, the biasing mechanism 206 is a coil spring that is captured between the lower rail member 156 of the rail 146 and a nut 210 that is threadedly connected to the locking pin 200 to provide the biasing force in the direction 208. But, in addition or alternatively to the illustrated coil spring, the biasing mechanism 206 may include any other type of biasing mechanism (e.g., another type of spring, etc.). Moreover, the locking pin 200 is not limited to the exemplary threaded fastener shown herein. Rather, the locking pin 200 may be held in position within the slots 160 and 162 and the openings 202, and the biasing mechanism 206 may be operatively connected to the locking pin 200, using any other method, means, mechanism, manner, connection, device, and/or the like, such as, but not limited to, an adhesive, an interference fit, a snap-fit, welding, brazing, an epoxy, a clip, a ring, a cotter pin, a quick release pin, a clevis-type connection, a bayonet connection, a spring override, and/or the like.

In operation, and referring now to FIGS. 4 and 7, as a person opens one of the door panels 118 from the closed position shown in FIG. 4 toward an open position shown in FIG. 7, the support member 134 of the corresponding door support system 132 moves from the retracted position shown in FIG. 4 to the extended position shown in FIG. 7. Specifically, as the door panel 118 moves from the closed position to the open position, the support member 134 slides along the length of the rail 146 in the direction 196 from the retracted position of FIG. 4 toward the extended position of FIG. 7. The support member 134 also pivots (e.g., rotates, etc.) about the pivot point 170 of the hinge 148 to accommodate the motion of the support member 134 and the corresponding door panel 118. As the support member 134 slides along the length of the rail 146 in the direction 196, the locking pin 200 slides within and along the length of the slot 162 in the direction 196 until the locking pin 200 reaches a notch 164a (best seen in FIG. 6) of the rail 146 that corresponds to an extended position of the support member 134 and thereby an open position of the corresponding door panel 118. Once the locking pin 200 reaches the notch 164a, the biasing force exerted by the biasing mechanism in the direction 208 forces the locking pin 200 into the notch 164a to thereby releasably lock the support member 134 in the extended position shown in FIG. 7 and thereby releasably lock the door panel 118 in the open position shown in FIG. 7. Specifically, engagement between the locking pin 200 and the notch 164a prevents the support member 134 from sliding along the length of the rail 146 in the direction 198 to thereby prevent the support member 134 from moving from the extended position shown in FIG. 7 toward the retracted position shown in FIG. 4. Accordingly, the extended position of the support member 134 shown in FIG. 7 supports the corresponding door panel 118 in the open position shown in FIG. 7 (e.g., prevents the door panel 118 from closing, etc.) against the weight of the door panel 118, against other forces (e.g., wind forces, inadvertent force applied by a person or animal, etc.) acting to close the door panel 118, despite failure of one or more gas springs, and/or the like. The extended position of the support member 134 shown in FIG. 7 thus prevents or reduces the likelihood and severity of injury to a person accessing the interior compartment 116 of the enclosure 102 caused by accidental closure of the door panel 118.

As the support member 134 slides along the length of the rail 146 in the direction 196, the biasing force provided by the biasing mechanism 206 in the direction 208 automatically forces the locking pin 200 into the notch 164*a* upon the locking pin 200 reaching the location of the notch 164*a* along the length of the rail 146. Accordingly, the detent 204 automatically locks the support member 134 in the extended position shown in FIG. 7 (and thereby automatically locks the corresponding door panel 118 in the open position shown in FIG. 7) as the door panel 118 is moved from the closed position to the open position shown in FIG. 7. In some examples, in addition or alternatively to the biasing mechanism 206, gravity may automatically force the locking pin 200 into the notch 164*a* upon the locking pin 200 reaching the location of the notch 164*a* along the length of the rail 146. In some examples, the detent 204 emits an audible indication that the support member 134 is releasably locked into an extended position. For example, the action of the locking pin 200 moving in the direction 208 into the notch 164*a* emits a snap and/or other noise that indicates that the support member 134 has been locked into the extended position shown in FIG. 7 in some examples.

To close the door panel 118 (e.g., move the door panel 118 from the open position shown in FIG. 7 to the closed position shown in FIG. 4, the support member 134 is unlocked (e.g., released, etc.) from the extended position shown in FIG. 7 by moving (e.g., pushing, pulling, etc.) the locking pin 200 in the direction of the arrow 212 against the bias of the biasing mechanism 206 to thereby move the locking pin 200 out of the notch 164*a*. Once the locking pin 200 has cleared (e.g., been removed from, etc.) the notch 164*a*, the door panel 118 can be moved from the open position shown in FIG. 7 to the closed position shown in FIG. 4. As the door panel 118 is moved to the closed position, the support member 134 slides along the length of the rail 146 from the extended position shown in FIG. 7 to the retracted position shown in FIG. 4.

Each door support system 132 may be configured to releasably lock the corresponding door panel 118 in any number of open positions. For example, the rail 146 may include any number of the notches 164 for releasably locking the support member 134 in any number of extended positions. Moreover, each notch 164 may have any location along the length of the rail 146 such that each notch 164 may be selected to correspond to any open position (e.g., any angular position of the door panel 118 relative to the frame 106 of the enclosure 102, etc.) In the exemplary embodiment, the rail 146 includes two notches 164 that correspond to two different extended positions and thus two different open positions of the corresponding door panel 118. Specifically, the rail 146 includes the notch 164*a* described above that corresponds to the extended and open position of the support member 134 and the door panel 118, respectively, that is shown in FIG. 7. Referring now to FIGS. 5 and 6, the exemplary embodiment includes another notch 164*b* (best seen in FIG. 7) that corresponds to the extended and open positions of the support member 134 and the door panel 118, respectively, shown in FIGS. 5 and 6. In other examples, one or more door support systems 132 only includes a single notch 164 (e.g., only the notch 164*a* or only the notch 164*b*, etc.) for releasably locking the corresponding door panel 118 in a single open position. Moreover, in other examples one or more door support systems 132 includes three or more notches 164 for releasably locking the corresponding door panel 118 in three or more open positions.

In the exemplary embodiment, the rail 146 also includes another notch 164*c* (shown in FIGS. 6 and 7). In some examples, the notch 164*c* corresponds to another extended position (not shown) and open position (not shown) at which the support member 134 and corresponding door panel 118, respectively, can be releasably locked by the detent 204. In other examples, the notch 164*c* does not correspond to any extended or open position at which the support member 134 and corresponding door panel 118, respectively, are releasably locked by the detent 204, but rather the notch 164*c* is provided merely so that the rail 146 has a universal (e.g., symmetrical, etc.) configuration and can therefore be installed on either of the door panels 118*a* or 118*b*. In other words, in some examples the range of travel of the support member 134 along the length of the slot 162 as the corresponding door panel 118 moves between the open position and the closed position does not include the notch 164*c* such that the locking pin 200 of the detent 204 never aligns along the length of the slot 162 with the notch 164*c* as the corresponding door panel 118 moves along the entire range of travel between the open and closed positions thereof.

Optionally, one or more of the door support systems 132 includes one or more notches 214 (shown in FIGS. 6 and 7). In some examples, the notch(es) 214 are positioned to releasably lock the support member 134 and corresponding door panel 118 in the retracted and closed positions, respectively, shown in FIGS. 2 and 4. In other examples, the notch 214 does not correspond to any retracted or closed position at which the support member 134 and corresponding door panel 118, respectively, are releasably locked by the detent 204, but rather the notch 214 is provided merely so that the rail 146 has a universal (e.g., symmetrical, etc.) configuration and can therefore be installed on either of the door panels 118*a* or 118*b*. In other words, in some examples the range of travel of the support member 134 along the length of the slot 162 as the corresponding door panel 118 moves between the open position and the closed position does not include the notch 214 such that the locking pin 200 of the detent 204 never aligns along the length of the slot 162 with the notch 214 as the corresponding door panel 118 moves along the entire range of travel between the open and closed positions thereof.

Each of the notches 164*a*, 164*b*, and 164*c* may be referred to herein as a "first notch" and/or a "second notch". The extended position of the support member 134 shown in FIGS. 1, 2, 5, and 6 and the extended position of the support member 134 shown in FIG. 7 may each be referred to herein as a "first extended position" and/or a "second extended position". The extended position of the support member 134 provided by the notch 164*c* may be referred to herein as a "first extended position" and/or a "second extended position". The open position of the door panel 118 shown in FIGS. 1, 2, 5, and 6 and the open position of the door panel 118 shown in FIG. 7 may each be referred to as a "first open position" and/or a "second open position". The open position of the door panel 118 provided by the notch 164*c* may be referred to as a "first open position" and/or a "second open position".

Referring again to FIGS. 1 and 2, the door support systems 132 are not limited to the locations shown herein. For example, each door support system 132 can be positioned at any other location along the height of the corresponding door panel 118.

Certain embodiments of the disclosure provide a door support system that enables the door panel of an electrical distribution system enclosure to be moved to and secured in an open position using less personnel. For example, certain embodiments of the disclosure provide a door support system that enables the door panel of an electrical distribution system enclosure to be safely moved to and secured in the open position by a single person.

Certain embodiments of the disclosure provide a door support system that increases the safety of installation, servicing, and/or operation of components of electrical distribution systems. Certain embodiments of the disclosure thereby reduce the likelihood and severity of injury to personnel installing, servicing, and/or operating electrical distribution systems. For example, certain embodiments of the disclosure provide a door support system that enables one or more personnel to safely open and secure the door panel of an electrical distribution system enclosure without being exposed to electrically live components (e.g., electrical components housed within the interior of the enclosure, portions of the enclosure carrying electricity, etc.). Moreover, and for example, certain embodiments of the disclosure provide a door support system that can better withstand wind conditions and/or component failures such that the door panels of electrical distribution systems are less likely to accidentally close onto personnel accessing interior compartments of electrical distribution system enclosures.

The following clauses describe further aspects of the disclosure, and any combination of the clauses is within the scope of the disclosure:

Clause Set A:

A1. A door support system for an enclosure of an electrical distribution system, the door support system comprising:
a rail configured to be fixedly secured to a door panel of the enclosure, the rail comprising at least one notch; and
a support member configured to be mounted to a frame of the enclosure, the support member being configured to be slidably mounted to the rail such that the support member slides along a length of the rail between an extended position and a retracted position, the extended position of the support member being configured to support the door panel in an open position of the door panel, the support member being configured to be in the retracted position when the door panel is in a closed position of the door panel, wherein the support member comprises a detent configured to be received into the notch of the rail to releasably lock the support member in the extended position along the length of the rail.

A2. The door support system of clause A1, wherein the detent comprises a locking pin and a biasing mechanism operatively connected to the locking pin such that the biasing mechanism is configured to force the locking pin into the notch of the rail when the support member slides along the length of the rail to the extended position.

A3. The door support system of clause A1, wherein the rail comprises a slot that extends along the length of the rail, the slot comprising the notch at a position along a length of the slot that corresponds to the extended position of the support member, the detent of the support member comprising a locking pin that extends within the slot and moves along the length of the slot as the support member slides along the length of the rail between the extended position and the retracted position.

A4. The door support system of clause A1, wherein the detent is configured to emit an audible indication that the support member is releasably locked in the extended position.

A5. The door support system of clause A1, wherein the detent is configured to automatically lock the support member in the extended position when the door panel is moved from the closed position to the open position.

A6. The door support system of clause A1, wherein the notch of the rail is a first notch, the extended position of the support member is a first extended position, and the open position of the door panel is a first open position, the rail comprising a second notch that corresponds to a second extended position of the support member wherein the support member is configured to support the door panel in a second open position of the door panel, the detent of the support member being configured to be received into the second notch of the rail to releasably lock the support member in the second extended position along the length of the rail.

A7. The door support system of clause A1, wherein the detent comprises a biasing mechanism configured to force the locking pin into the notch of the rail when the support member slides along the length of the rail to the extended position, the detent being configured to be moved out of the notch against the bias of the biasing mechanism to unlock the support member from the extended position.

A8. The door support system of clause A1, wherein the support member is mounted to the frame of the enclosure at a hinge.

A9. The door support system of clause A1, wherein at least one of the rail or the support member comprises a u-shape.

Clause Set B:

B1. An enclosure for an electrical distribution system, the enclosure comprising:
a frame having an interior compartment configured to hold at least one electrical component;
a door panel mounted to the frame at a hinge, the door panel being movable about the hinge between a closed position that closes an opening of the frame and an open position that exposes the interior compartment through the opening; and
a door support system comprising:
a rail fixedly secured to the door panel, the rail comprising at least one notch; and
a support member mounted to the frame of the enclosure, the support member being slidably mounted to the rail such that the support member slides along a length of the rail between an extended position and a retracted position, the extended position of the support member supporting the door panel in an open position of the door panel, the support member being in the retracted position when the door panel is in a closed position of the door panel, wherein the support member comprises a detent configured to be received into the notch of the rail to releasably lock the support member in the extended position along the length of the rail.

B2. The enclosure of clause B1, wherein the detent comprises a locking pin and a biasing mechanism operatively connected to the locking pin such that the biasing mechanism is configured to force the locking pin into the notch of the rail when the support member slides along the length of the rail to the extended position.

B3. The enclosure of clause B1, wherein the rail comprises a slot that extends along the length of the rail, the slot comprising the notch at a position along a length of the slot that corresponds to the extended position of the support member, the detent of the support member comprising a locking pin that extends within the slot and moves along the length of the slot as the support member slides along the length of the rail between the extended position and the retracted position.

B4. The enclosure of clause B1, wherein the detent is configured to emit an audible indication that the support member is releasably locked in the extended position.

B5. The enclosure of clause B 1, wherein the detent is configured to automatically lock the support member in the extended position when the door panel is moved from the closed position to the open position.

B6. The enclosure of clause B1, wherein the notch of the rail is a first notch, the extended position of the support member is a first extended position, and the open position of the door panel is a first open position, the rail comprising a second notch that corresponds to a second extended position of the support member wherein the support member is configured to support the door panel in a second open position of the door panel, the detent of the support member being configured to be received into the second notch of the rail to releasably lock the support member in the second extended position along the length of the rail.

B7. The enclosure of clause B1, wherein the detent comprises a biasing mechanism configured to force the locking pin into the notch of the rail when the support member slides along the length of the rail to the extended position, the detent being configured to be moved out of the notch against the bias of the biasing mechanism to unlock the support member from the extended position.

B8. The enclosure of clause B1, wherein the support member is mounted to the frame of the enclosure at a hinge.

Clause Set C:

C1. A door support system for an enclosure of an electrical distribution system, the door support system comprising:

a rail configured to be fixedly secured to a door panel of the enclosure, the rail comprising a slot that extends along a length of the rail, the slot comprising at least one notch; and a support member configured to be mounted to a frame of the enclosure, the support member being configured to be slidably mounted to the rail such that the support member slides along the length of the rail between an extended position and a retracted position, the extended position of the support member being configured to support the door panel in an open position of the door panel, the support member being configured to be in the retracted position when the door panel is in a closed position of the door panel, wherein the support member comprises a detent that includes a locking pin and a biasing mechanism configured to force the locking pin into the notch of the slot when the support member slides along the length of the rail to the extended position to releasably lock the support member in the extended position.

C2. The door support system of clause C1, wherein the locking pin extends within the slot and moves along the length of the slot as the support member slides along the length of the rail between the extended position and the retracted position.

C3. The door support system of clause C1, wherein the support member is mounted to the frame of the enclosure at a hinge.

It is to be understood that the above description is intended to be illustrative, and not restrictive. For example, the above-described embodiments (and/or aspects thereof) may be used in combination with each other. Furthermore, invention(s) have been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention(s). Further, each independent feature or component of any given assembly may constitute an additional embodiment. In addition, many modifications may be made to adapt a particular situation or material to the teachings of the disclosure without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the disclosure should, therefore, be determined with reference to the appended claims, along with the full scope of equivalents to which such claims are entitled.

In the foregoing description of certain embodiments, specific terminology has been resorted to for the sake of clarity. However, the disclosure is not intended to be limited to the specific terms so selected, and it is to be understood that each specific term includes other technical equivalents which operate in a similar manner to accomplish a similar technical purpose. Terms such as "clockwise" and "counterclockwise", "left" and right", "front" and "rear", "above", "below", "upper", and "lower" and the like are used as words of convenience to provide reference points and are not to be construed as limiting terms.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. For example, in this specification, the word "comprising" is to be understood in its "open" sense, that is, in the sense of "including", and thus not limited to its "closed" sense, that is the sense of "consisting only of". A corresponding meaning is to be attributed to the corresponding words "comprise", "comprised", "comprises", "having", "has", "includes", and "including" where they appear. Further, references to "one embodiment" or "one aspect" are not intended to be interpreted as excluding the existence of additional embodiments or aspects that also incorporate the recited features. Moreover, unless explicitly stated to the contrary, embodiments "comprising" or "having" an element or a plurality of elements having a particular property can include additional elements not having that property. The term "exemplary" is intended to mean "an example of."

The phrase "one or more of the following: A, B, and C" means "at least one of A and/or at least one of B and/or at least one of C." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

Although the terms "step" and/or "block" may be used herein to connote different elements of methods employed, the terms should not be interpreted as implying any particular order among or between various steps herein disclosed unless and except when the order of individual steps is explicitly described. The order of execution or performance of the operations in examples of the disclosure illustrated and described herein is not essential, unless otherwise specified. The operations may be performed in any order, unless otherwise specified, and examples of the disclosure may include additional or fewer operations than those disclosed herein. It is therefore contemplated that executing or performing a particular operation before, contemporaneously with, or after another operation is within the scope of aspects of the disclosure.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A door support system for an enclosure of an electrical distribution system, the door support system comprising:
   a rail configured to be fixedly secured to a door panel of the enclosure, the rail comprising at least one notch; and
   a support member configured to be mounted to a frame of the enclosure, the support member being configured to be slidably mounted to the rail such that the support member slides along a length of the rail between an extended position and a retracted position, the extended position of the support member being configured to support the door panel in an open position of the door panel, the support member being configured to be in the retracted position when the door panel is in a closed position of the door panel, wherein the support member comprises a detent that includes a locking pin and a spring operatively connected to the locking pin such that the spring is configured to force the locking pin into the notch of the rail to releasably lock the support member in the extended position along the length of the rail.

2. The door support system of claim 1, wherein the rail comprises a slot that extends along the length of the rail, the slot comprising the notch at a position along a length of the slot that corresponds to the extended position of the support member, the locking pin extending within the slot and moving along the length of the slot as the support member slides along the length of the rail between the extended position and the retracted position.

3. The door support system of claim 1, wherein the detent is configured to emit an audible indication that the support member is releasably locked in the extended position.

4. The door support system of claim 1, wherein the detent is configured to automatically lock the support member in the extended position when the door panel is moved from the closed position to the open position.

5. The door support system of claim 1, wherein the notch of the rail is a first notch, the extended position of the support member is a first extended position, and the open position of the door panel is a first open position, the rail comprising a second notch that corresponds to a second extended position of the support member wherein the support member is configured to support the door panel in a second open position of the door panel, the detent of the support member being configured to be received into the second notch of the rail to releasably lock the support member in the second extended position along the length of the rail.

6. The door support system of claim 1, wherein the locking pin of the detent is configured to be moved out of the notch against a bias of the spring to unlock the support member from the extended position.

7. The door support system of claim 1, wherein the support member is mounted to the frame at a hinge.

8. The door support system of claim 1, wherein at least one of the rail or the support member comprises a u-shape.

9. An enclosure for an electrical distribution system, the enclosure comprising:
   a frame having an interior compartment configured to hold at least one electrical component;
   a door panel mounted to the frame at a hinge, the door panel being movable about the hinge between a closed position that closes an opening of the frame and an open position that exposes the interior compartment through the opening; and
   a door support system comprising:
      a rail fixedly secured to the door panel, the rail comprising at least one notch; and
      a support member mounted to the frame, the support member being slidably mounted to the rail such that the support member slides along a length of the rail between an extended position and a retracted position, the extended position of the support member supporting the door panel in an open position of the door panel, the support member being in the retracted position when the door panel is in a closed position of the door panel, wherein the support member comprises a detent that includes a locking pin and a spring operatively connected to the locking pin such that the spring is configured to force the locking pin into the notch of the rail to releasably lock the support member in the extended position along the length of the rail.

10. The enclosure of claim 9, wherein the rail comprises a slot that extends along the length of the rail, the slot comprising the notch at a position along a length of the slot that corresponds to the extended position of the support member, the locking pin extending within the slot and moving along the length of the slot as the support member slides along the length of the rail between the extended position and the retracted position.

11. The enclosure of claim 9, wherein the detent is configured to emit an audible indication that the support member is releasably locked in the extended position.

12. The enclosure of claim 9, wherein the detent is configured to automatically lock the support member in the extended position when the door panel is moved from the closed position to the open position.

13. The enclosure of claim 9, wherein the notch of the rail is a first notch, the extended position of the support member is a first extended position, and the open position of the door panel is a first open position, the rail comprising a second notch that corresponds to a second extended position of the support member wherein the support member is configured to support the door panel in a second open position of the door panel, the detent of the support member being configured to be received into the second notch of the rail to releasably lock the support member in the second extended position along the length of the rail.

14. The enclosure of claim 9, wherein the locking pin of the detent is configured to be moved out of the notch against a bias of the spring to unlock the support member from the extended position.

15. The enclosure of claim 9, wherein the support member is mounted to the frame of the enclosure at a hinge.

16. A door support system for an enclosure of an electrical distribution system, the door support system comprising:
- a rail configured to be fixedly secured to a door panel of the enclosure, the rail comprising a slot that extends along a length of the rail, the slot comprising at least one notch; and
- a support member configured to be mounted to a frame of the enclosure, the support member being configured to be slidably mounted to the rail such that the support member slides along the length of the rail between an extended position and a retracted position, the extended position of the support member being configured to support the door panel in an open position of the door panel, the support member being configured to be in the retracted position when the door panel is in a closed position of the door panel, wherein the support member comprises a detent that includes a locking pin and a spring operatively connected to the locking pin such that the spring is configured to force the locking pin into the notch of the slot when the support member slides along the length of the rail to the extended position to releasably lock the support member in the extended position.

17. The door support system of claim 16, wherein the locking pin extends within the slot and moves along the length of the slot as the support member slides along the length of the rail between the extended position and the retracted position.

18. The door support system of claim 16, wherein the support member is mounted to the frame of the enclosure at a hinge.

19. The door support system of claim 16, wherein the detent is configured to emit an audible indication that the support member is releasably locked in the extended position.

20. The door support system of claim 16, wherein the detent is configured to automatically lock the support member in the extended position when the door panel is moved from the closed position to the open position.

* * * * *